United States Patent
Smith et al.

(10) Patent No.: US 7,545,881 B2
(45) Date of Patent: Jun. 9, 2009

(54) METHOD AND APPARATUS FOR CONTROLLING SPURIOUS TRANSMISSIONS IN A COMMUNICATIONS SYSTEM

(75) Inventors: Alan Andrew Smith, Farnborough (GB); Julie Stuart, legal representative, Longfield (GB); Zhi-Zhong Yu, Reading (GB)

(73) Assignee: QUALCOMM Incorporated, San Diego, CA (US)

( * ) Notice: Subject to any disclaimer, the term of this patent is extended or adjusted under 35 U.S.C. 154(b) by 707 days.

(21) Appl. No.: 11/136,269

(22) Filed: May 23, 2005

(65) Prior Publication Data

US 2006/0262879 A1    Nov. 23, 2006

(51) Int. Cl.
*H04L 25/03* (2006.01)
(52) U.S. Cl. .................. 375/297; 375/295; 375/296; 375/278; 375/279; 375/280
(58) Field of Classification Search ......... 375/295, 375/296, 297, 278, 279, 280
See application file for complete search history.

(56) References Cited

U.S. PATENT DOCUMENTS

| | | | |
|---|---|---|---|
| 7,010,057 B2 * | 3/2006 | Vayrynen et al. ........ | 375/295 |
| 7,035,590 B2 * | 4/2006 | Ishiguro et al. ........ | 455/63.1 |
| 7,158,494 B2 * | 1/2007 | Sander et al. ........ | 370/329 |
| 7,177,370 B2 * | 2/2007 | Zhang et al. ........ | 375/297 |
| 7,324,787 B2 * | 1/2008 | Kurakami et al. ........ | 455/69 |
| 2005/0054308 A1 | 3/2005 | Vayrynen et al. | |
| 2005/0282508 A1 * | 12/2005 | Huang et al. ........ | 455/127.2 |
| 2006/0050812 A1 * | 3/2006 | Hietala et al. ........ | 375/308 |

FOREIGN PATENT DOCUMENTS

WO    WO 03/036896 A2    5/2003

OTHER PUBLICATIONS

P. Bode et al., "Combined GMSK and 8PSK Modulator for GSM and EDGE", ISCAS 2003, Proceedings of the 2003 IEEE International Symposium on Circuits and Systems. Bangkok, Thailand, May 25-28, 2003, IEEE International Symposium on Circuits and Systems, New York, NY: IEEE, US, vol. 3 of 5, May 25, 2003, pp. III-614, Xp002318484, ISBN: 0-7803-7761-3.

* cited by examiner

*Primary Examiner*—Chieh M Fan
*Assistant Examiner*—Siu M Lee
(74) *Attorney, Agent, or Firm*—Larry J. Moskowitz (57) ABSTRACT

A method and a power control device moving the resynchronisation point within the guard period to coincide with a calculated reduction in the RF PA power level such that the spurious frequency products are attenuated as much as possible and moved to be as central as possible within the guard period such that neither the previous burst nor the next burst are affected.

14 Claims, 6 Drawing Sheets

METHOD AND APPARATUS FOR CONTROLLING SPURIOUS TRANSMISSIONS IN A COMMUNICATIONS SYSTEM

BACKGROUND OF THE INVENTION

I. Field of the Invention

The invention relates to a method and apparatus for controlling spurious transmissions in a communications system. More specifically, the invention relates to a method and apparatus for controlling spurious transmissions during inter-burst changeovers in a communications system.

II. Description of the Related Art

Modem communication systems, such as cellular and satellite radio systems, employ various modes of operation (analog, digital, dual mode, etc.), and access techniques such as frequency division multiple access (FDMA), time division multiple access (TDMA), code division multiple access (CDMA), and hybrids of these techniques.

In FDMA systems, a communication channel is a single radio frequency band into which a signal's transmission power is concentrated. Interference with adjacent channels is limited by the use of bandpass filters which only pass signal energy within the specified frequency band. Thus, with each channel being assigned a different frequency, system capacity is limited by the available frequencies as well as by limitations imposed by radio channels.

In TDMA systems, a channel consists of a time slot in a periodic train of time intervals over the same frequency. Each period of time slots is called a frame. A given signal's energy is confined to one of these time slots. Adjacent channel interference is limited by the use of a time gate or other synchronization element that only passes signal energy received at the proper time. Thus, the portion of the interference from different relative signal strength levels is reduced. In North America, a digital cellular radiotelephone system using TDMA is called the digital advanced mobile phone service (D-AMPS), some of the characteristics of which are specified in the TIA/EIA/IS-136 standard published by the Telecommunications Industry Association and Electronic Industries Association (TIA/EIA).

Global System for Mobile Communication (GSM) is based on technologies of advanced TDMA. The general packet radio system (GPRS) is a packet data based communication system that has been developed for GSM networks with the aim of providing networks built to this standard with a way to handle higher data speeds and packet switched connections. GPRS can also be used in TDMA networks (IS-136). It is intended to provide a transitional path to third generation (3G) wireless data services. It enables the introduction of packet switching and Internet Protocol (IP). The GPRS standard is now well defined and is currently being deployed in existing GSM-based mobile networks, in order to provide a way for GSM operators to meet the growing demand for wireless packet data services.

An example in the trend toward wireless evolution has been the development of the Enhanced Data Rates for GSM Evolution (EDGE) which is currently under standardization within the European Telecommunication Standards Institute (ETSI). The EDGE specification has been developed so as to offer packet data communications at high speeds within current frequency bands and is based on the current GSM TDMA frame structure, logical channel structure and 200 kHz carrier bandwidth. The current GSM and D-AMPS installed base stations can be upgraded in a step-wise manner for a gradual evolution to the higher bit rates. This enables systems operating in accordance with both network standards to achieve improved bit-rate performance within current frequency allocations and in existing cell plans.

In TDMA systems and even to varying extents in CDMA systems, each radio channel is divided into a series of time slots, each of which contains a burst of information from a user. The time slots are grouped into successive frames that each have a predetermined duration, and successive frames may be grouped into a succession of what are usually called superframes.

In GSM, for example, a single full-rate frame contains 8 time slots with a time duration of 4.615 ms and 1250 bits. Each time slot consists of 156.25 bits with a time duration of 0.57692 ms. GSM uses five different types of the bursts (time slots): normal burst, synchronization burst, frequency correction burst, access burst, and dummy burst.

Figure 1A:
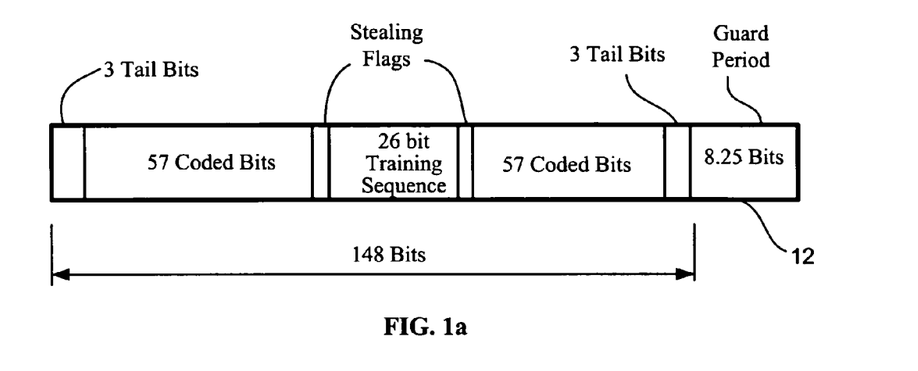
FIG. 1a shows a normal burst structure for GSM/GPRS/EDGE, as previously described herein.

FIG. 1a shows normal burst structure for GSM. The normal burst is used to carry information on traffic channel and control channels. This burst contains 156.25 bits. It is defined as 3 Tail Bits, 57 Coded Bits, 1 bit Stealing Flag, 26 bit Training Sequence, 1 bit Stealing Flag, 57 Coded Bits, 3 Tail Bits, and 8.25 bits of guard period. The encrypted bits are 57 bits of data or speech plus one bit stealing Flag to indicate whether the burst was stolen for Fast Associated Control Channel signalling or not. The training sequence is a 26 bit pattern which is used by the equalizer to create a channel model. The tail bits are always equal (0,0,0). The guard period 12 is empty space and is used to prevent overlap between adjacent time slots during transmission. They are used to provide start and stop bit patterns. While 1 symbol corresponds to 1 bit for GSM/GPRS, 1 symbol corresponds to 3 bits for EDGE.

Figure 1B:
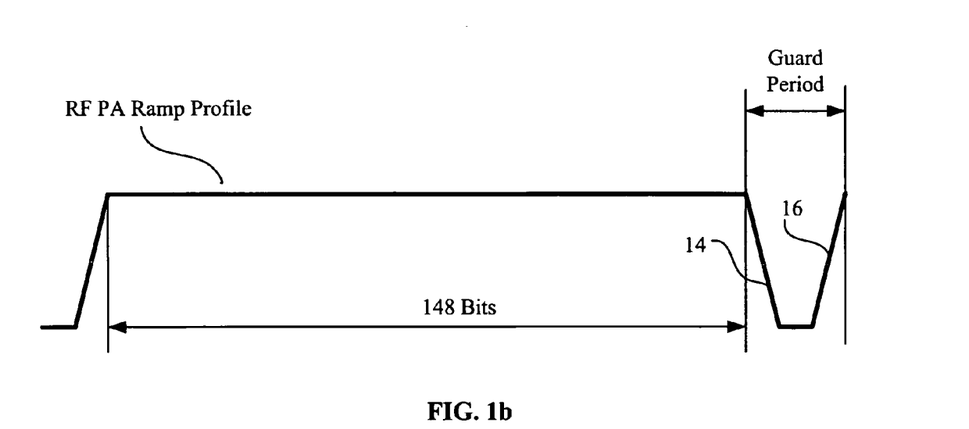
FIG. 1b shows a RF PA ramp profile, as previously described herein.

FIG. 1b shows radio frequency (RF) Power Amplifier (PA) ramp profile for 1 burst. During guard period corresponding to 8.25 bits, RF PA power control signal is powered down following line 14 and powered up following line 16 for the next burst.

In the mean time, in the higher classes of GSM, GPRS/EDGE and other multi-slot TDMA systems, the Mobile Station (MS) is allowed to transmit more than a single TDMA burst on the UpLink (UL). This is to achieve higher data rates. Where the Mobile Station (MS) is allowed to transmit several adjacent bursts on the UpLink (UL), the transmitting MS has to resynchronise its Transmitter during the guard period between UL bursts.

Since the guard period 12 lasts for 8.25 bits, which means that in a multi-slot situation there is a problem which requires the modulator to be re-synchronised to the start of the next burst due to the 0.25 symbol remainder. Implicit in this is that after modulating 8 symbols, and getting 25% through modulating the 9th symbol, the modulator has to be re-synchronised to start modulating the data for the next burst. This resynchronisation causes discontinuities in the output of the modulator which results in spurious frequency products being sent through the transmit path of the mobile station (MS). Since the RF PA power control remains on, the spurious frequency products are radiated over-air such that they can violate the spectral mask defined for GSM/GPRS/EDGE and contribute to increased system noise.

Figure 2:
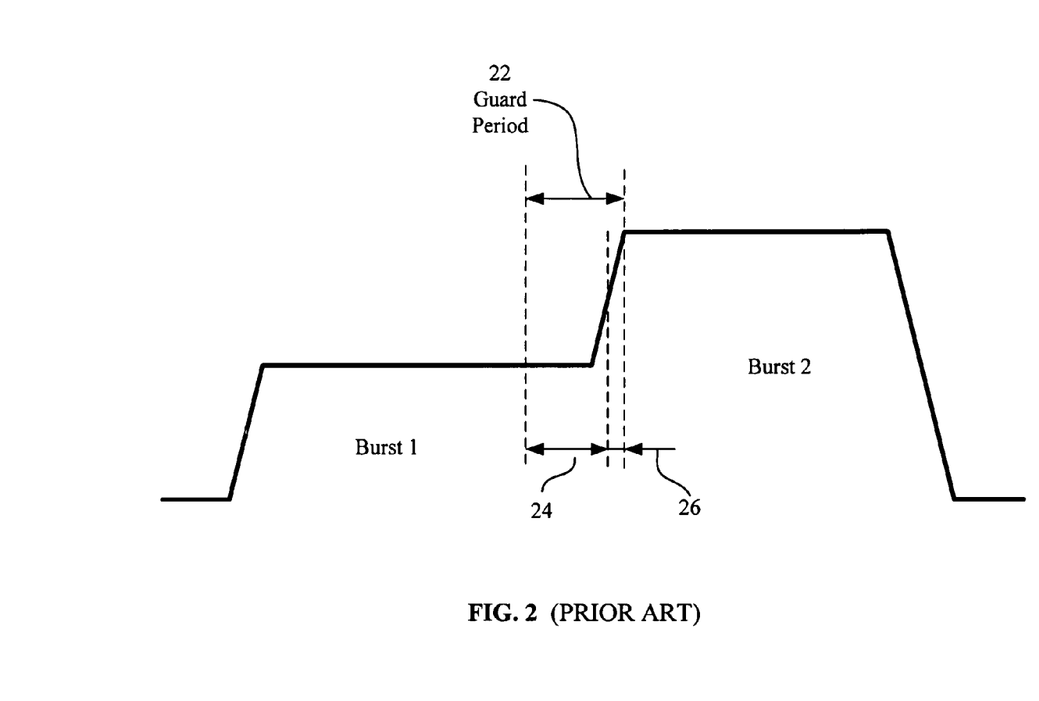
FIG. 2 shows a typical RF PA power control ramp profile for adjacent bursts in prior art where the second burst uses higher power level than the first, as previously described herein.

The problem may be better understood from consideration of the accompanying FIG. 2, which shows an example of prior art where the MS transmits two TDMA bursts on the UL. The second burst here uses higher power level than the first burst. The guard period 22 lasts for 8.25 bits during which the modulator should be re-synchronised to the start of the second burst 2 due to the 0.25 symbol remainder. In FIG. 2, after modulating 8 symbols corresponding to time period 24 and getting 25% through modulating the 9th symbol corresponding to time period 26, the modulator has to be re-synchronised to start modulating the data for the second burst 2 causing discontinuities in the modulator output and imposing spurious frequency products on the second burst 2.

Therefore, when the resynchronisation is left too late and done just prior to the first Tail Bit of the next burst, there is a risk that the Tail Bits may suffer distortion. It will thereby degrade system performance. To avoid that, some receivers will require the Tail Bits to be especially well formed. A similar situation exists with regards to the last Tail bit of the previous burst when the resynchronisation is left too early and done just after the last Tail Bit of the former burst.

Figure 3:
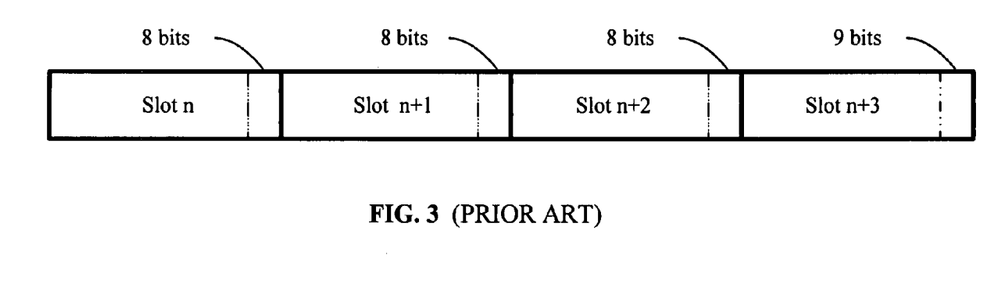
FIG. 3 shows a scheme in prior art using a leap symbol at every $4^{th}$ frame, as previously described herein.

One method is to ignore the quarter bit and add a "leap symbol" to every 4th frame, so the guard period for 4 consecutive bursts become 8, 8, 8, 9 bits in length. FIG. 3 shows this scheme. Each of the first three consecutive slots i.e., slots n, n+1, n+2 has 8 bits of guard period ignoring the quarter bit. But the fourth slot i.e., slot n+3 has 8 bits of guard period plus a leap symbol. ETSI spec allows multiple-timeslot user to transmit in this way.

However, this scheme is unsatisfactory because, although it may work in practice, it no longer meets the specification for GSM/GPRS timing. The Network would see a quarter symbol "dither" on the timing of the MS which may reduce the accuracy of the time tracking to half-symbol or worse.

In the meantime, since in EDGE and Dynamic synchronous transfer mode (DTM) operation each burst of multi-slot is independently controlled and the modulation changes, the above alone is not enough. For example, defined by ETSI GSM 05.04, EDGE (EGPRS) uses two modulation schemes, Gaussian Minimum Shift Keying (GMSK) and 8 Phase Shift Keying (8PSK). The two modulation schemes are different in many ways. The most obvious one is that GMSK has constant amplitude, while 8PSK has variable amplitude. GMSK only modulates the phase and keeps the amplitude constant, while 8PSK modulates both phase and amplitude. By doing this 8PSK triples GMSK transmitting data rate.

The introduction of EDGE (and GPRS) means that in the near future a mobile station (MS), i.e. a mobile telephone, will be able to make a voice call at the same time as a data call. That often requires both GMSK and 8PSK modulations in time slot next to each other. This means that both modulation schemes can be in the same spectrum and can appear in two adjacent bursts on both downlink and uplink. For downlink BS transmitter normally does not switch off ramp down at end of each burst, as it needs to transmit in the next burst. For uplink, when there are two adjacent time slots, similar to BS, it is desirable not to power down at the end of the first burst and power up at the beginning of the next one as described in FIG. 2. However, as the power is on in the guard period, it has to be controlled carefully to minimise the interference to others.

The standard specification has defined a spectrum mask for the transition. It needs joint efforts from both baseband and RF to satisfy the requirement and it is desirable to keep the emission as low as possible.

Moreover, if the two bursts are of different modulations, for example, GMSK followed by 8PSK or the other way, the issue arising from such case is that the direct transition between the two modulations often generates spurious spectrum from the output stage of baseband signal, which will appear in RF and cause violation of the mask. Therefore it is necessary condition for both BS and MS baseband to be able to handle transition between adjacent GMSK and 8PSK bursts without generating unwanted frequency components. Since the transition between GMSK and 8PSK may be necessary on top of the power changes, it could cause extra frequency components without further developed control or process.

SUMMARY OF THE INVENTION

It is therefore an object of the present invention to provide a method and a power control device moving the resynchronisation point within the guard period to coincide with a calculated reduction in the RF PA power level such that the spurious frequency products are attenuated as much as possible and moved to be as central as possible within the guard period such that neither the previous burst nor the next burst are affected.

According to one aspect of the invention there is provided a method for controlling spurious transmissions during inter-burst changeovers in a communication system in which each channel is divided into a series of bursts, the method comprising ramping down a PA power at the beginning of a guard period in a first burst, resynchronizing to a second burst following the first burst, ramping up the PA power to a power level of the second burst required for transmission of data; and transmitting data to a receiving entity, wherein the PA power is reduced to level as low as possible while time is available for the resynchronization and then subsequently the PA power is ramped up within the guard period while remaining above the predetermined minimum level.

According to another aspect of the invention there is provided a transmitter controlling spurious transmissions during inter-burst changeovers in a communication system comprising control unit for producing a power level control signal indicating ramping down PA power at the beginning of a guard period at the end of a first burst and ramping up PA power to a power level of the second burst required for transmission of data and a timing signal indicating initiation point in time for resynchronization, modulation unit for resynchronization to the second burst according to the timing signal and power amplifier for amplifying transmission power with a ramp profile as instructed by the power level control signal, wherein the control signal firstly controls the ramping down of PA power to a level as low as possible while time is available for the resynchronization and secondly controls the ramping up of PA power within the guard period while remaining above the predetermined minimum level.

The invention also provides a power control device for use in controlling a transmitter in a communication system in which data is synchronously transmitted in bursts and power characteristics of the bursts vary between one burst and the next, the device being arranged to move a resynchronisation point within a guard period between consecutive bursts to coincide with a calculated change in the power characteristics between one burst and the next in order to attenuate spurious frequency products and to move the same to be substantially within the guard period in order that that neither the previous burst nor the next burst are affected thereby.

The method and transmitter embodying the invention are applicable to any communication system where each channel is divided into a series of bursts and especially where inter-burst changeovers are needed such as from GMSK to 8PSK modulation on a burst by burst basis in addition to changing transmit power levels. The method and transmitter embodying the invention can limit the amount of spurious products being transmitted during the guard period between two adjacent TDMA bursts using active power control of the RF PA. The method and the transmitter embodying the invention also help to solve a specification compliance issue which is potentially costly to resolve.

The above and further features of the invention are set forth with particularity in the appended claims and together with advantages thereof will become clearer from consideration of the following detailed description of an exemplary embodiment of the invention given with reference to the accompanying drawings.

DETAILED DESCRIPTION OF AN EMBODIMENT OF THE INVENTION

An embodiment of the invention will now be described with reference to the accompanying drawings. FIGS. 1 to 3 of the accompanying drawings have already been described herein above. The following description will begin with FIG. 4, which shows an RF PA power control where a second burst 2 requires higher power than a first burst 1.

It might be suggested here that a potentially disruptive influence i.e., a resynchronization point in time, should be moved as far away as possible, such as to the centre of the guard period. This in theory would be the best position for it to occupy in some situations. However, where the second burst is to be transmitted at a different power level than the first as seen in FIG. 4 as an example, it is needed to allow enough time for the RF PA power control signal to first ramp down during time period 44 to the minimum possible value that can be achieved within the guard period, followed by the 0.25 symbol time during time period 46 where the resynchronisation is done, and also followed by the RF PA power control signal ramping up during time period 48 to the required power level for the next burst.

This problem is addressed by moving the resynchronisation point within the guard period to coincide with a calculated reduction in the RF PA power control signal. In this way, the spurious frequency products are attenuated as much as possible. Moreover, any existing spurious products can be placed as centrally as possible within the guard period. This prevents the previous burst and the next burst being affected by the spurious products.

Figure 4:
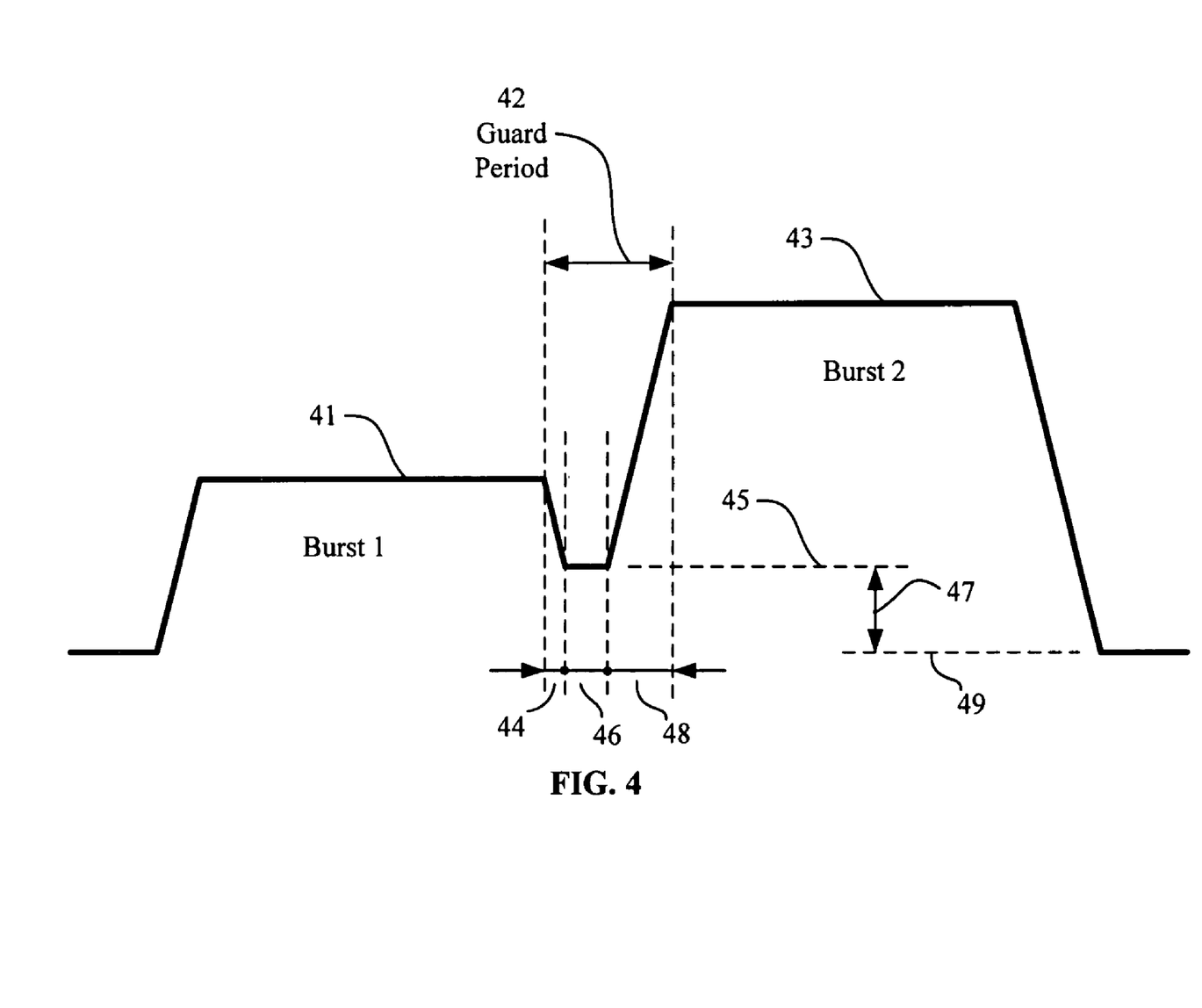
FIG. 4 shows a RF PA power control where a second burst requires higher power than a first burst, as might be embodied in this invention.

In FIG. 4, at the end of the first burst 1, during time period 44 within guard period 42, the RF PA power control signal is first ramped down from power level 41 to the possible minimum power level 45. During time period 46, which may correspond to the 0.25 symbol time, resynchronization occurs. Next, during time period 48, the RF PA power control signal ramps up to the required power level 43 for the second burst 2. The rates of ramping up and ramping down may be the same or different and will, in practice, depend on specific implementation details.

One thing to note is that in some situations the power level difference between two adjacent bursts may be relatively large. When this happens there may not be enough time available within the guard period to reach the predetermined minimum power level before starting to ramp back up again for the next burst. In this case, the power level required for the next burst takes priority and the RF PA power control signal will be simply ramped down as far as possible before resynchronising and ramping back up to the power level of next burst. In other words, it is the power level for the next burst that will dictate how far the RF PA power control can be ramped down prior to the resynchronisation. The power level for the next burst thus also dictates at what point in the guard period the resynchronisation will be done. The resynchronisation point may be moved towards the front of the guard period.

FIG. 4 shows by way of example a difference in the power level between the first burst 1 and the second burst 2 which is relatively large. If the RF PA power control signal is ramped down from power level 41 to the predetermined minimum power level, for example the level corresponding to the broken line 49, within the guard period 42, it is possible that there will not be enough time available for the signal to ramp back up to the required power level 43 of second burst 2. Under these circumstances, the power level required for the second burst 2 takes priority and the RF PA power control signal will be simply ramped down to the power level represented by the broken line 45. Thus the signal will be ramped down as low as possible while still providing the time required for resynchronization 46 and ramping back up 48 to the power level 43 of second burst 2.

The difference between the predetermined minimum power level 49 and the reduced power level 45 is a will be differential represented by arrowed line 47. Depending on the height of the differential 47, the resynchronisation point will be moved by a greater or lesser amount toward the front of the guard period 42. A person skilled in the relevant art should readily appreciate that the differential amount 47 will vary and may even fall to zero depending on the rate of ramping down, the rate of ramping up, the power level differential between two adjacent bursts, and the predetermined minimum power level 49.

Figure 5:
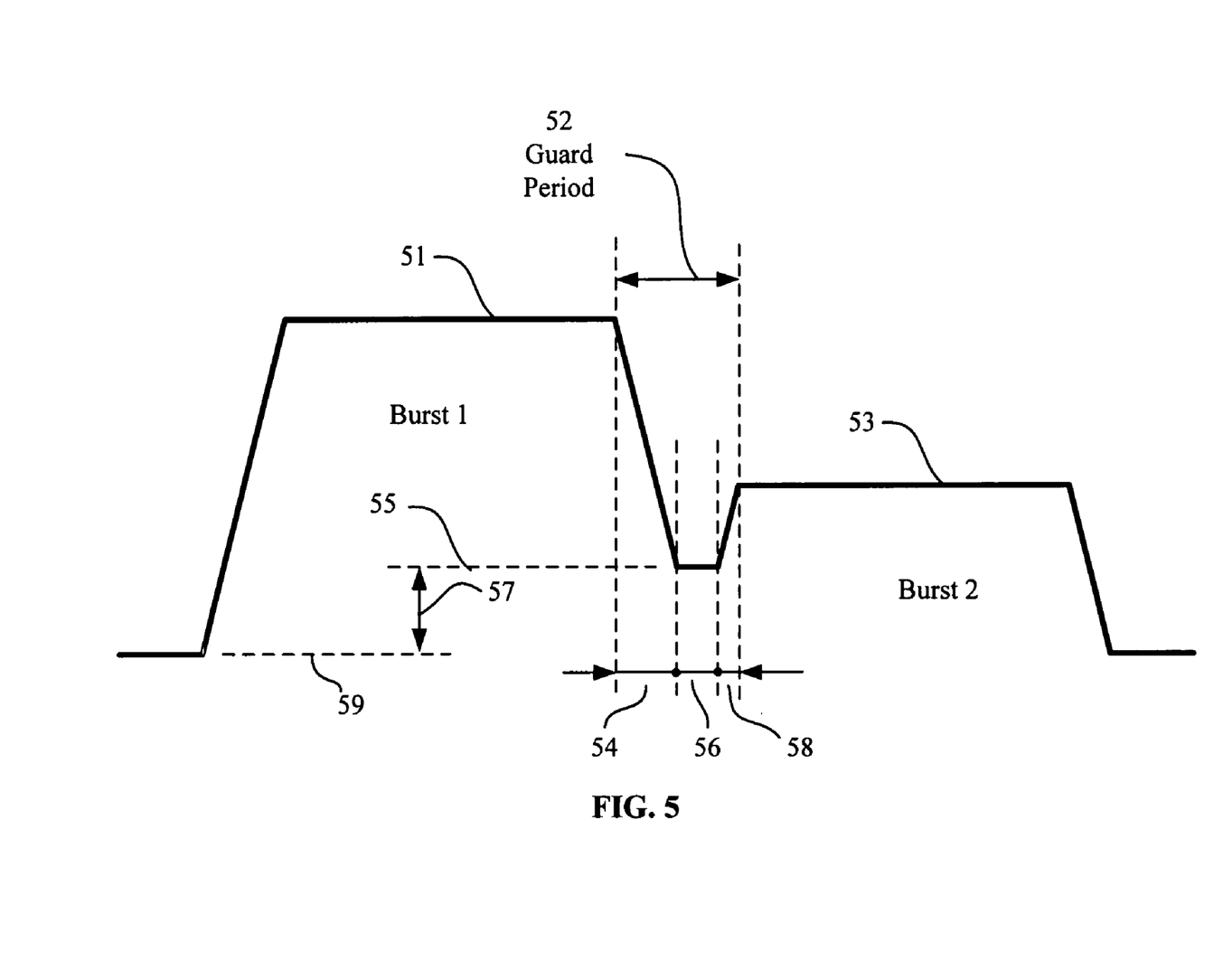
FIG. 5 shows a RF PA power control where a first burst requires higher power than a second burst, as might be embodied in this invention.

FIG. 5 of the accompanying drawings shows the reverse situation where the first burst 1 is at a high power and the next, i.e. second, burst 2 is at a low power. In this situation, the RF PA power control signal is controlled in a similar manner to that just described with reference to FIG. 4.

As shown in FIG. 5, the RF PA power control signal is first ramped down from power level 51 to the minimum possible power level 55 during time period 54 within guard period 52. During time period 56, which may correspond to the 0.25 symbol time, resynchronization occurs. Next, during time period 58 the RF PA power control signal ramps up to the required power level 53 for the second burst 2. The rates of ramping up and ramping down may be the same or different and will, in practice, depend on specific implementation details.

Consequently, if the RF PA power control signal is ramped down from power level 51 to the predetermined minimum power level 59 within guard period 52, for example, there may not be enough time available for the signal to ramp back up to the required power level 53 of second burst 2. Under these circumstances, the power level required for the second burst 2 takes priority and the RF PA power control signal will be simply ramped down to the power level represented by the broken line 55. Thus, the signal will be ramped down as low as possible while still providing the time required for resynchronization 56 and ramping back up 58 to the power level 53 of second burst 2.

The difference between the predetermined minimum power level 59 and the reduced power level 55 is different as amount represented by arrowed line 57. Depending on the height of the differential 57, the resynchronisation point will be moved by a greater or lesser amount closer to the end of the guard period.

Figure 6:
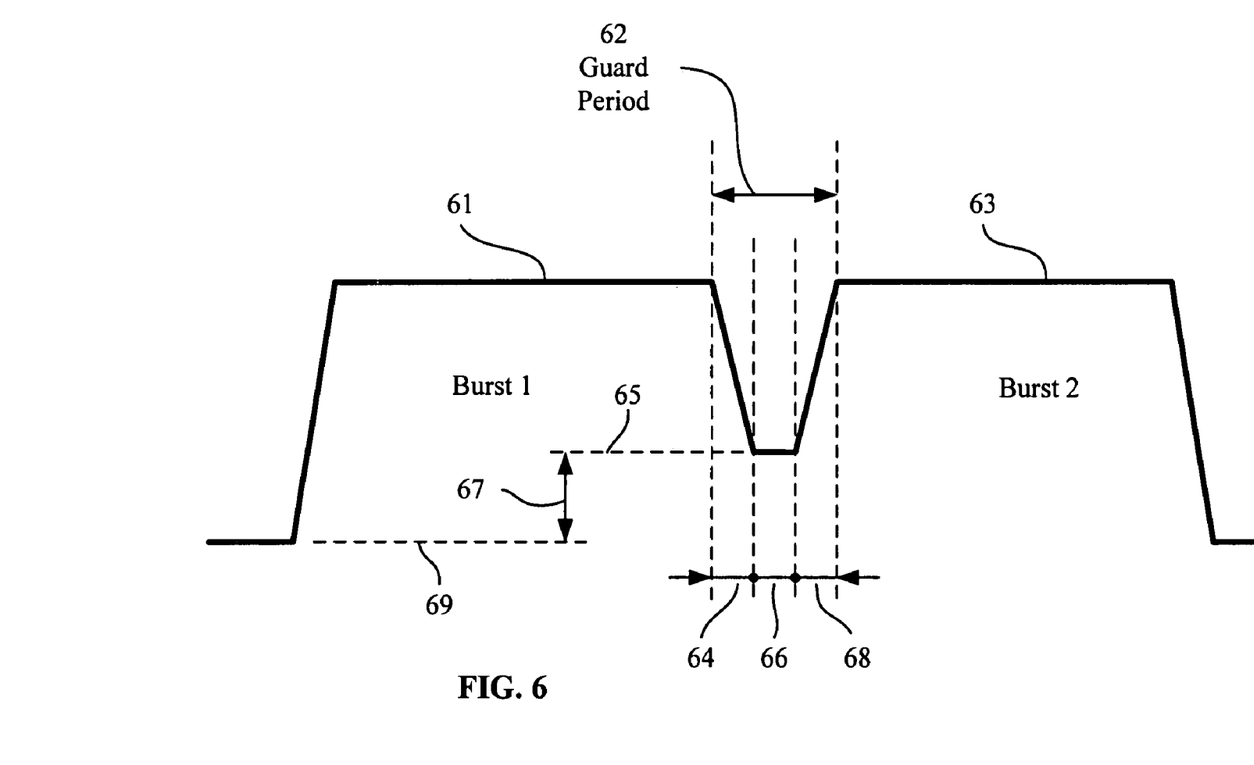
FIG. 6 shows a RF PA power control where a first burst requires the same power as a second burst, as might be embodied in this invention.

FIG. 6 shows a RF PA power control signal where the first burst 1 requires the same power as the second burst 2. The RF PA power control signal shown in FIG. 6 is controlled in a similar manner to that just described with reference to FIGS. 4 and 5.

As shown in FIG. 6, the RF PA power control signal is first ramped down from power level 61 to the minimum possible power level 65 during time period 64 within guard period 62. During time period 66, which may correspond to the 0.25 symbol time, resynchronization occurs. Next, the RF PA power control signal ramps up during time period 68 to the required power level 63 for the second burst 2. The rates of ramping up and ramping down may be the same or different and will, in practice, depend on specific implementation details. Consequently, if the RF PA power control signal is ramped down from power level 61 to the predetermined minimum power level 69 within guard period 62, for example, there may not be enough time available for the signal to ramp back up to the required power level 63 of second burst 2. Under these circumstances, the power level required for the second burst 2 takes priority and the RF PA power control signal will be simply ramped down to the power level represented by the broken line 65. Thus, the signal will be ramped down as low as possible while still providing the time required for resynchronization 66 and ramping back up 68 to the power level 63 of second burst 2.

The difference between the predetermined minimum power level 69 and the reduced power level 65 is a differential as amount represented by arrowed line 67. A person skilled in the relevant art should readily appreciate that the differential amount 67 will vary and may even fall to zero depending on the rate of ramping down, the rate of ramping up, the power level differential 67 between two adjacent bursts, and the predetermined minimum power level 69.

In the situation shown in FIG. 6, the resynchronization point may be located as far away as possible from the tail bits of the bursts i.e., to the centre of the guard period. This in theory is the best position for it to occupy when the rates of ramping down and ramping up are the same or substantially similar.

Figure 7:
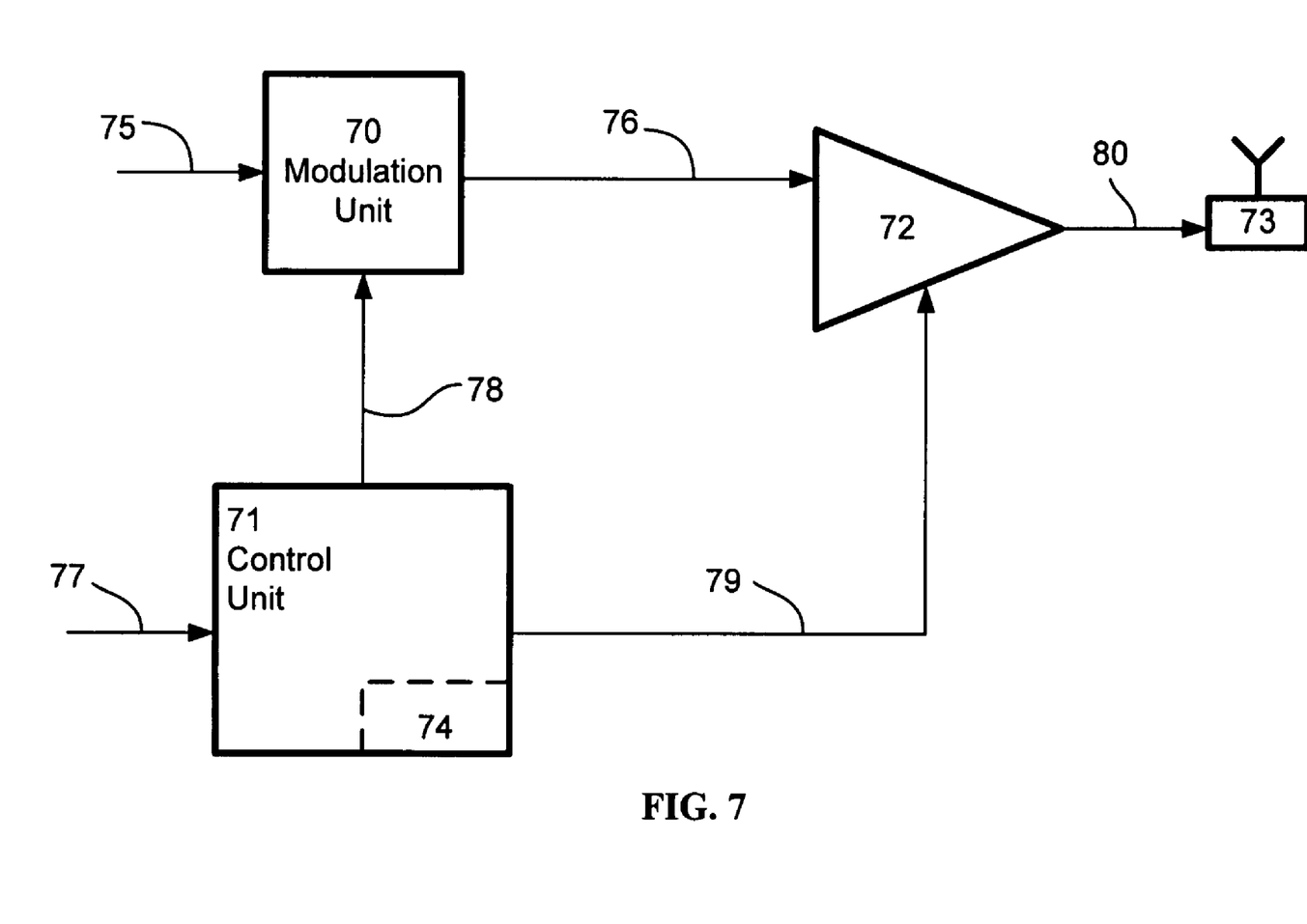
FIG. 7 shows a simplified block diagram of a transmitter.

FIG. 7 of the accompanying drawings shows a schematic block diagram of a transmitter capable of performing the above described operations. The transmitter typically forms part of a mobile telephone (not shown) for use in a cellular communication system and which therefore typically comprises a receiver, a controller and baseband circuitry in addition to the transmitter.

The transmitter shown in FIG. 7 comprises a modulation unit 70, a power amplifier (PA) circuit 72, and a control unit 71. Input data 75 from a data source (not shown) is provided to the modulation unit 70 where it is modulated and output as a modulated signal 76. The modulated signal 76 output from the modulation unit 70 is input to the power amplifier 72 where it is amplified to a predetermined power level. Thereafter, the PA 72 outputs an amplified RF signal 80 to an antenna 73 via a duplexer switch and possibly other components (not shown) for transmission.

The control unit 71 is coupled to receive a control input signal 77 from the mobile telephone controller (not shown) which, in turn, receives control information from a system controller (not shown) in the cellular communication system in which the mobile telephone is being used. The control unit 71 as shown is coupled to a control input of the PA circuit 72 so that it can provide a power level control signal 79 to the power amplifier (PA) 72. Thus, the predetermined power level to which the input signal is amplified is controlled by the power level control signal 79 from the control unit 71.

The control unit 71 includes a memory device 74, which may, for example, be an addressable ROM or RAM. The memory device 74 stores data defining a set of different ramp-up and ramp-down sequences to be applied to the PA 72 at different times. These sequences are typically predefined by an air interference standard. For example, certain GSM transmitters may have 16 different power levels. As such, there can be, for example, 16 different ramp-up sequences and 16 different ramp-down sequences stored in the memory device 74.

The control unit 71 responds to the input control signal 77 by retrieving data for one of the stored sequence of ramp-up and ramp-down values from the memory device 74. The data representing the retrieved power control sequence pass through a digital-to-analog converter (not shown) and a filter (not shown) where they are converted to analog signals and then smoothed before being sent to control the PA 72. Control unit 71 also produces a timing signal 78 which indicates triggering point in time for resynchronization at the modulation unit (70).

The above described transmitter is suitable for use in a communication system in which data is synchronously transmitted in bursts and power characteristics of the bursts vary between one burst and the next. The transmitter is controlled by moving a resynchronisation point within a guard period between consecutive bursts to coincide with a calculated change in the power characteristics between one burst and the next in order to attenuate spurious frequency products and to move the same to be substantially within the guard period in order that that neither the previous burst nor the next burst are affected thereby.

In this way, the transmitter operates to control spurious transmissions during inter-burst changeovers in a communication system in which each channel is divided into a series of bursts. The PA power is ramped down at the beginning of a guard period in a first burst. The transmitter is then resynchronized to a second burst following said first burst. Next the PA power is ramped up to a power level of said second burst required for the transmission of data. Then the data is transmitted. The PA power is reduced to level as low as possible while time is available for said resynchronization and for said ramping up within said guard period but not exceeding the predetermined minimum level.

The above described method and transmitter are applicable to any communication system where each channel is divided into a series of bursts and especially where inter-burst changeovers is needed such as from GMSK to 8PSK modulation on a burst by burst basis in addition to changing transmit power levels. The above described method and transmitter limit the amount of spurious products being transmitted during the guard period between two adjacent TDMA bursts using active power control of the RF PA. They also help solve a specification compliance issue which is potentially costly to resolve.

Having thus described the invention by reference to a preferred embodiment it is to be well understood that the embodiment in question is exemplary only and that modifications and variations such as will occur to those possessed of appropriate knowledge and skills may be made without departure from the spirit and scope of the invention as set forth in the appended claims and equivalents thereof.

The invention claimed is:

1. A method for controlling spurious transmissions during inter-burst changeovers in a communication system in which each channel is divided into a series of bursts, said method comprising:
   ramping down a power amplifier (PA) power at the beginning of a guard period in a first burst;
   resynchronizing to a second burst following said first burst;
   ramping up said PA power to a power level of said second burst required for transmission of data; and
   transmitting data to a receiving entity,
   wherein said PA power is reduced to a reduced level that is as low as possible while time is available for said resynchronization and for said ramping up within said guard period while remaining above a predetermined minimum level, a resynchronization point being moved within the guard period depending on a differential between the reduced level and the predetermined minimum level.

2. A method as described in claim 1, wherein said ramping down and said ramping up are performed according to a predetermined rate.

3. A method as described in claim 1, wherein said ramping down and said ramping up are performed according to a sequence stored.

4. A method as described in claim 1, wherein said second burst requires higher power level for transmitting data than for said first burst.

5. A method as described in claim 4, wherein said resynchronizing step is performed at a front part of said guard period.

6. A method as described in claim 1, wherein said first burst requires higher power level for transmitting data than for said second burst.

7. A method as described in claim 6, wherein said resynchronizing step is performed at a rear part of said guard period.

8. A method as described in claim 1, wherein said first burst requires the same power level for transmitting data as for said second burst.

9. A method as described in claim 8, wherein said resynchronizing step is performed substantially at a center of said guard period.

10. A method as described in claim 1, wherein said communication system is the Enhanced Data Rates for GSM Evolution (EDGE) system.

11. A method as described in claim 1, wherein said communication system is modified Code Division Multiple Access (CDMA) system in which each channel is further divided into a series of time slots.

12. A transmitter controlling spurious transmissions during inter-burst changeovers in a communication system in which each channel is divided into a series of bursts, said transmitter comprising:
    control unit (71) for producing a power level control signal indicating ramping down power amplifier (PA) power at the beginning of a guard period in a first burst and ramping up PA power to a power level of a second burst required for transmission of data and a timing signal indicating initiation point in time for resynchronization;
    modulation unit (70) for resynchronization to said second burst according to said timing signal; and
    power amplifier (72) for amplifying transmission power with a ramp profile as instructed by said power level control signal,
    wherein said control signal instructing ramping down PA power to a reduced level that is as low as possible while time is available for said resynchronization and for said ramping up within said guard period while remaining above a predetermined minimum level, the point in time for resynchronization being moved within the guard period depending on a differential between the reduced level and the predetermined minimum level.

13. A transmitter as described in claim 12, wherein said control unit (71) has a memory device (74) storing a sequence of ramping up and ramping down.

14. An apparatus for controlling spurious transmissions during inter-burst changeovers in a communication system in which each channel is divided into a series of bursts; said apparatus comprising:
    means for ramping down a power amplifier (PA) power at the beginning of a guard period in a first burst;
    means for resynchronizing to a second burst following said first burst;
    means for ramping up said PA power to a power level of said second burst required for transmission of data; and
    means for transmitting data to a receiving entity, wherein said PA power is reduced to a reduced level that is as low as possible while time is available for said resynchronization and for said ramping up within said guard period while remaining above a predetermined minimum level, a resynchronization point being moved within the guard period depending on a differential between the reduced level and the predetermined minimum level.

* * * * *